(12) United States Patent
Yoneda et al.

(10) Patent No.: US 6,924,508 B2
(45) Date of Patent: Aug. 2, 2005

(54) ORGANIC ELECTROLUMINESCENCE PANEL

(75) Inventors: Kiyoshi Yoneda, Mizuho (JP); Ryuji Nishikawa, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/627,116

(22) Filed: Jul. 24, 2003

(65) Prior Publication Data

US 2004/0069987 A1 Apr. 15, 2004

(30) Foreign Application Priority Data

Jul. 25, 2002 (JP) ........................................ 2002-216654

(51) Int. Cl.[7] .................. H01L 29/04; H01L 35/24; H01L 27/01; H01J 1/62
(52) U.S. Cl. ...................... 257/72; 257/40; 257/347; 313/504
(58) Field of Search .............................. 257/40, 59, 72, 257/347; 313/504

(56) References Cited

U.S. PATENT DOCUMENTS

2003/0230976 A1 * 12/2003 Nishikawa et al. ......... 313/504

* cited by examiner

*Primary Examiner*—Steven Loke
(74) *Attorney, Agent, or Firm*—Cantor Colburn LLP

(57) ABSTRACT

A first moisture blocking layer formed of a silicon type nitride film such as SiNx or the like is formed over the entire surface so as to cover a drain electrode and a source electrode of a TFT. On the first moisture blocking layer, a first planarization film formed of an organic material is provided. On the first planarization film, a second moisture blocking layer formed of SiNx or the like is provided. In the peripheral region, the second moisture blocking layer extends down on the first moisture blocking layer and is connected with the first moisture blocking layer. Also, a sealing glass is bonded to the second moisture blocking layer using the sealing member. By enclosing the first planarization film by the first moisture blocking layer and the second moisture blocking layer, intrusion of external moisture can be effectively prevented.

11 Claims, 2 Drawing Sheets

ORGANIC ELECTROLUMINESCENCE PANEL

BACKGROUND OF THE INVENTION

1. Field of the Invention

The present invention relates to an organic electroluminescence (EL) panel comprising, on a substrate, organic EL elements arranged in a matrix and a plurality of thin film transistors for driving the organic EL elements, in which a sealing panel is bonded to the peripheral portion of the substrate for sealing the area above the pixel region where the organic EL elements are provided.

2. Description of Related Art

Organic EL display panels (organic EL display panels) have conventionally been known as one example of flat display panels. Because, unlike liquid crystal display (LCD) panels, organic EL display panels are self emissive and because organic EL display panels are bright and clear flat display panels, their widespread use is very much expected.

An organic EL display panel comprises a large number of organic EL elements arranged in a matrix, and employs these organic EL elements as pixels of a display. Such organic EL elements can be driven passively or actively, similar to LCDs, and, as is also the case with LCDS, active matrix displays are more preferable. More specifically, in active matrix displays, switching elements (typically two elements including a switching element and a driving element) are provided for each pixel and display of each pixel is controlled by controlling the switching elements, whereas in passive driving, a switching element is not provided for each pixel. Of these two types of displays, the active matrix is more preferable because much more precise displays can be achieved.

The organic EL element emits light when current flows through an organic emissive layer. In many cases, a hole transport layer and an electron transport layer formed of an organic material are provided adjacent to the organic emissive layer, in order to assist the light emission. These organic layers, however, suffer from a problem of deterioration when exposed to moisture.

To deal with the above problem, in an organic EL display, the area above the display region where the organic EL element is provided is covered with a cathode formed of a metal, and the space above the display region (a region where a pixel is disposed) is made airtight and a drying agent placed in the airtight space, thereby removing moisture.

However, such a conventional organic EL display panel often does not have a sufficiently long life. In this regard, our study has revealed that the space above the organic EL element is often not sufficiently dry, namely that effective prevention of intrusion of external moisture is not sufficiently performed in that space.

SUMMARY OF THE INVENTION

According to the present invention, it is possible to provide an organic EL panel in which intrusion of moisture into the space above an organic EL element can be effectively prevented.

In accordance with one aspect of the present invention, there is provided an organic electroluminescence panel, comprising a substrate including organic electroluminescence elements arranged in a matrix and a plurality of thin film transistors for driving the organic electroluminescence elements, wherein a sealing panel covering an area above a display area in which the organic electroluminescence elements are disposed is connected to the substrate in the peripheral portion of the substrate, the plurality of thin film transistors are covered with a planarization film, the organic electroluminescence elements are formed above the planarization film, a moisture blocking layer is provided over the planarization film, and the moisture blocking layer is bonded to the sealing panel using a sealing member, thereby connecting the substrate with the sealing panel.

As described above, by connecting the moisture blocking layer formed so as to cover the planarization film with the sealing member to seal the periphery of the panel, the planarization film can be separated from the organic EL element with the moisture blocking layer interposed therebetween. This makes it possible to effectively prevent intrusion of moisture into the organic EL elements within the panel from the periphery of the panel, particularly through the planarization film having a high moisture absorption property.

In accordance with another aspect of the present invention, there is provided an organic electroluminescence panel, comprising a substrate including organic electroluminescence elements arranged in a matrix and a plurality of thin film transistors for driving the organic electroluminescence elements, wherein a sealing panel covering an area above a display area in which the organic electroluminescence elements are disposed is connected to the substrate in the peripheral portion of the substrate, the plurality of thin film transistors are covered with a planarization film, the organic electroluminescence elements are formed above the planarization film, a first moisture blocking layer is provided under the planarization film and above the thin film transistors, a second moisture blocking layer is provided over the planarization film, the second moisture blocking layer is bonded to the sealing panel using a sealing member, thereby connecting the substrate with the sealing panel, and the first moisture blocking layer and the second moisture blocking layer are directly connected with each other in the peripheral region of the substrate, so that a side portion of the planarization film is enclosed by the first and second moisture blocking layers.

As described above, by covering the side portion of the planarization film with the moisture blocking layers, it is possible to prevent the intrusion of moisture through the planarization film into the panel. It is also possible to prevent intrusion of moisture into the planarization film even when the planarization film is made of a material with high moisture absorption property, because the planarization film is enclosed by the moisture blocking layers. Further, even when the planarization film absorbs moisture during manufacturing, the moisture will not enter the organic layer because the planarization film is enclosed by the moisture blocking layers.

It is preferable that the moisture blocking layer is formed of silicon nitride, because silicon nitride is highly moisture proof and stable.

In accordance with a further aspect of the present invention, there is provided an organic electroluminescence panel, comprising a substrate including organic electroluminescence elements arranged in a matrix and a plurality of thin film transistors for driving the organic electroluminescence elements, wherein a sealing panel covering an area above a display area in which the organic electroluminescence elements are disposed is connected to the substrate in the peripheral portion of the substrate, the plurality of thin film transistors are covered with a first planarization film, the organic electroluminescence elements are formed above the first planarization film, a moisture blocking layer is provided over the first planarization film, each of the organic electroluminescence element comprises a lower electrode, an upper electrode and an organic layer including an organic emissive material, a second planarization film covers edge portions of the lower electrode and is formed in a non-emissive region of the display region, in a region where a sealing member is bonded to the moisture blocking layer, the first planarization film extends under the moisture blocking layer, the second planarization film terminates at a point which is further inside of the panel with respect to the region where the moisture blocking layer is bonded to the sealing member, and the moisture blocking layer is bonded to the sealing panel using the sealing member, thereby connecting the substrate with the sealing panel.

As described above, when the second planarization film is provided, the second planarization film is made to terminate at a point which is further inside the panel with respect to the region where the moisture blocking layer is bonded to the sealing member, so that intrusion of external moisture into the organic EL elements through this second planarization film can be reliably prevented.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENTS

A preferred embodiment of the present invention will be described in further detail with reference to the accompanying drawings.

Figure 1:
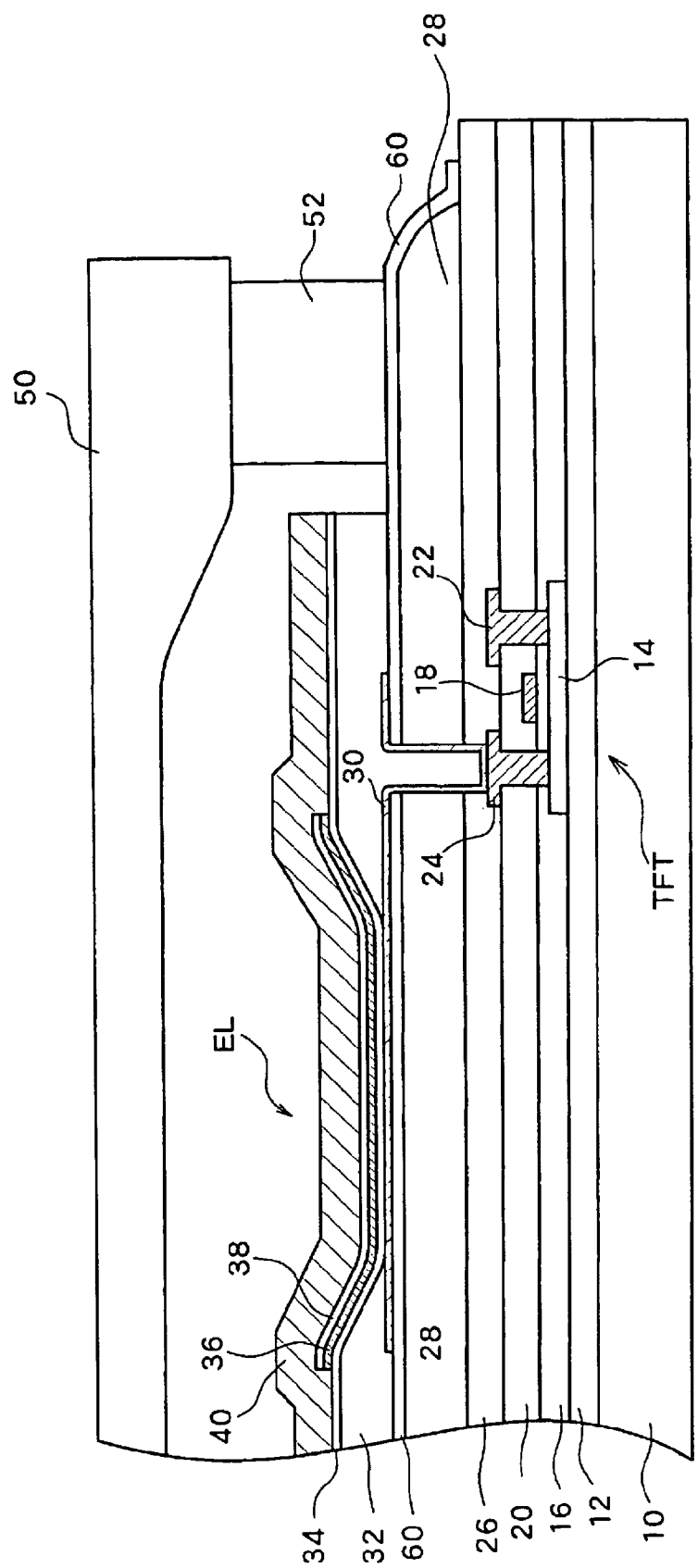
FIG. 1 is a cross sectional view of an organic EL panel in accordance with an embodiment of the present invention.

FIG. 1 is a cross sectional view showing a main portion of one preferred embodiment of the present invention. On a glass substrate 10, an insulating film (buffer layer) 12 formed of two layers, an SiNx layer and an $SiO_2$ layer which are stacked in this order from the substrate side, is provided so as to prevent impurities from the glass substrate 10 from entering. On main portions of the insulating film 12, a large number of thin film transistors are formed. Although in FIG. 1 a second TFT which is a thin film transistor for controlling current flowing from a power source line to the organic EL element is shown, a first TFT is also provided for each pixel for controlling accumulation of voltages supplied from the data line in a capacitor. The second TFT is switched on in accordance with the voltage accumulated in the capacitor for controlling current flowing from the power source line to the organic EL element.

More specifically, a semiconductor layer 14 which is formed of poly-Si and constitutes an active layer of the TFT is formed on the insulating film 12. Then, a gate insulating film 16 formed of two layers, an $SiO_2$ layer and an SiNx layer which are stacked in this order, is formed so as to cover the semiconductor layer 14. A gate electrode 18 formed of Mo or the like is provided via the gate insulating film 16 above the semiconductor layer 14 so as to cover a portion of the semiconductor layer 14. An inter-layer insulating film 20 formed of two layers, an SiNx layer and an $SiO_2$ layer, which are stacked in that order, is further formed so as to cover the semiconductor layer 14, the gate insulating film 16, and the gate electrode 18. Further, towards ends on the semiconductor layer 14, a drain electrode 22 and a source electrode 24 made of aluminum, for example, are formed by forming a contact hole through the inter-layer insulating film 20 and the gate insulating film 16.

A first moisture blocking layer 26 formed of SiNx or TEOS is further formed over the entire surface of the substrate so as to cover the inter-layer insulating film 20, the drain electrode 22, and the source electrode 24.

Further, over the first moisture blocking layer 26, a first planarization film 28 formed of an organic material such as an acrylic resin is formed. A second moisture blocking layer 60 formed, similar to the first moisture blocking layer 26, of SiNx or TEOS is formed on the first planarization film 28. Then, on the second moisture blocking layer 60, a transparent electrode 30 such as ITO is formed for each pixel as an anode of the organic EL element.

A part of the transparent electrode 30 extends down on the source electrode 24, where the transparent electrode 30 is formed along the inner surface of a contact hole through which the top surface of the source electrode 24 is exposed. In this manner, the source electrode 24 is directly connected with the transparent electrode 30.

Edge portions of the transparent electrode 30 are covered with a second planarization film 32 formed of an organic insulating material, such as a resin, which is similar to that used for the first planarization film 28. Thus, short-circuit between the edge portions of the anode 30 and the cathode which will be formed with the organic layers interposed therebetween is prevented. Further, in the organic EL element, a portion in which the anode and the cathode directly face each other via the organic layers corresponds to the emissive region. Therefore, a portion of the organic EL element formed in the peripheral region of the pixel area, which corresponds to an area outside the emissive region of one pixel, serves as a non-emissive region due to the existence of the second planarization film 32.

A hole transport layer 34 is then formed over the entire surface of the second planarization film 32 and the transparent electrode 30. With such a configuration, because the second planarization film 32 has an opening in the emissive region, the hole transport layer 34 is in direct contact with the transparent electrode 30, which serves as the anode, in the emissive region. On the hole transport layer 34, an emissive layer 36 and an electron transport layer 38 which are slightly larger than the emissive region are sequentially stacked in this order for each pixel. On these layers, a cathode 40 made of aluminum or the like is formed. In the present embodiment, the hole transport layer 34, the emissive layer 36 and the electron transport layer 38 are formed between the anode 30 and the cathode 40, and these layers construct an emissive element layer, of the organic EL element, having at least one organic compound layer.

Accordingly, when the second TFT is turned on, current is supplied via the source electrode 24 to the transparent electrode 30 of the organic EL element, and flows between the transparent electrode 30 and the cathode 40. In accordance with the current, the organic EL element emits light.

In this example, the second TFT is configured by two transistors which are connected in parallel and cause current to flow from two drains to one source. The first TFT, on the other hand, is typically double-gate type in which two transistors are connected in series. The first TFT, though different from the second TFT in its planar configuration and connection, has a laminated structure similar to that of the second TFT.

In the present embodiment, the insulating film 12, the gate insulating film 16, the inter-layer insulating film 20, and the first moisture blocking layer 26 are formed over the entire surface of the substrate so as reach the periphery on the glass substrate 10, whereas the first planarization film 28 terminates slightly before reaching the periphery, where the side surface of the first planarization film 28 is covered by the second moisture blocking layer 60. Further, the second planarization film 32, the hole transport layer 34, and the cathode 40 terminate further before the periphery. Accordingly, as shown in FIG. 1, a sealing member 52 used for bonding a sealing glass 50 to the glass substrate 10 is bonded to the second moisture blocking layer 60 on the glass substrate 10, and the second moisture blocking layer 60 covers the side surface of the first planarization film 28 and terminates on the first moisture blocking layer 26 provided outside the sealing member 52.

The sealing member 52, for which a UV cured resin such as an epoxy resin is used, is directly adhered to the second moisture blocking layer 60. The second moisture blocking layer 60 is formed of a silicon type nitride layer such as SiNx and TEOS (tetraethoxysilane), and prohibits transport of moisture into the inner layers. It is therefore possible to effectively prevent external moisture from entering the space inside the sealing glass 50. A silicon nitride film (SiNx film) is especially preferable for the second moisture blocking layer 60.

Figure 2:
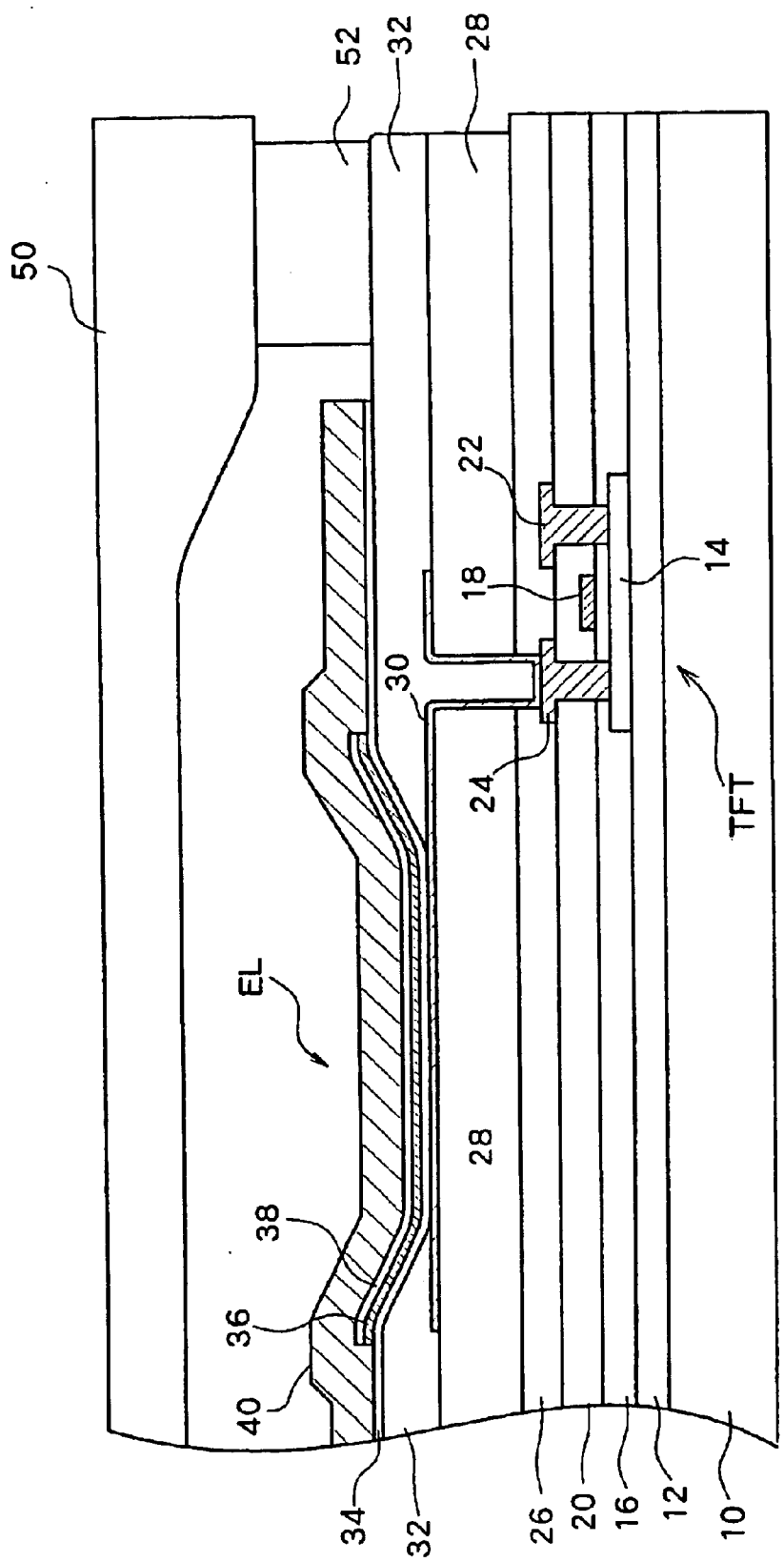
FIG. 2 is a cross sectional view of an organic EL panel according to related art.

As shown in FIG. 2, when the first and second planarization films 28, 32 are formed on the glass substrate 10 so as to extend to the region under the sealing member 52, it is likely that external moisture will be introduced into the panel through the first and second planarization films 28, 32, because these films 28, 32 are formed of an organic material such as an acrylic resin and have higher moisture absorption property than SiNx or the like.

According to the present embodiment, on the other hand, the first planarization film 28 is completely covered with an inorganic film having high moisture resistance such as SiNx or the like, so that the space in which the organic EL element is provided is basically enclosed by the second moisture blocking film 60, the sealing member 52, and the sealing glass 50, thereby effectively preventing moisture from reaching the organic EL element. Further, because the second planarization film 32 terminates at a point which is further inside the panel with respect to the panel region where the sealing member 52 is bonded, it is also possible to reliably prevent moisture from entering the panel via the second planarization film 32.

Further, a driver circuit which also comprises a large number of thin film transistors (TFTs) is often provided in the periphery portion of the glass substrate 10 where the sealing member 52 is disposed. The driving thin film transistors are usually formed on the glass substrate 10 in the same manufacturing step as that for forming the first and second TFTs which are provided for each pixel. Accordingly, in many cases, thin film transistors are provided under the sealing member 52. In such a case, source and drain electrodes of the thin film transistor protrude above the inter-layer insulating film 20, which generates a step in the first moisture blocking layer 26 covering the inter-layer insulating film 20 and these electrodes of the thin film transistor.

According to the present embodiment, however, the above problem is eliminated by providing the first planarization film 28 which planarizes the above-described step.

As described above, according to the embodiment of the present invention, the moisture blocking layer formed on the planarization film is connected to the sealing member so as to seal the periphery of the panel. Thus, the planarization film can be separated from the organic EL element, so that intrusion of moisture from the peripheral region can be effectively prevented.

Further, because the side portion of the planarization film is covered with the moisture blocking layer, it is possible to prevent moisture intrusion through the planarization film into the panel.

In addition, silicon nitride is preferable for the moisture blocking layer because it is highly moisture proof and stable.

While the preferred embodiment of the present invention has been described using specific terms, such description is for illustrative purposes only, and it is to be understood that changes and variations may be made without departing from the spirit or scope of the appended claims.

What is claimed is:

1. An organic electroluminescence panel, comprising a substrate including organic electroluminescence elements arranged in a matrix and a plurality of thin film transistors for driving the organic electroluminescence elements, wherein a sealing panel covering an area above a display area in which the organic electroluminescence elements are disposed is connected to the substrate in a peripheral portion of the substrate, the plurality of thin film transistors are covered with a planarization film, the organic electroluminescence elements are formed above the planarization film, a moisture blocking layer is provided over the planarization film, and the moisture blocking layer is bonded to the sealing panel using a sealing member, thereby connecting the substrate with the sealing panel.

2. An organic electroluminescence panel according to claim 1, wherein the moisture blocking layer is formed of silicon nitride.

3. An organic electroluminescence panel according to claim 1, wherein in a region where the sealing member is bonded to the moisture blocking layer, the planarization film extends under the moisture blocking layer.

4. An organic electroluminescence panel, comprising a substrate including organic electroluminescence elements arranged in a matrix and a plurality of thin film transistors for driving the organic electroluminescence elements, wherein a sealing panel covering an area above a display area in which the organic electroluminescence elements are disposed is connected to the substrate in a peripheral portion of the substrate, the plurality of thin film transistors are covered with a planarization film, the organic electroluminescence elements are formed above the planarization film, a first moisture blocking layer is provided under the planarization film and above the thin film transistors, a second moisture blocking layer is provided over the planarization film, the second moisture blocking layer is bonded to the sealing panel using a sealing member, thereby connecting the substrate with the sealing panel, and the first moisture blocking layer and the second moisture blocking layer are directly connected with each other in the peripheral portion of the substrate, so that a side portion of the planarization film is enclosed by the first and second moisture blocking layers.

5. An organic electroluminescence panel according to claim 4, wherein
the first moisture blocking layer and the second moisture blocking layer are formed of silicon nitride.

6. An organic electroluminescence panel according to claim 4, wherein
in a region where the sealing member is bonded to the second moisture blocking layer, the planarization film extends under the second moisture blocking layer.

7. An organic electroluminescence panel, comprising a substrate including organic electroluminescence elements arranged in a matrix and a plurality of thin film transistors for driving the organic electroluminescence elements, wherein
a sealing panel covering an area above a display area in which the organic electroluminescence elements are disposed is connected to the substrate in a peripheral portion of the substrate,
the plurality of thin film transistors are covered with a first planarization film,
the organic electroluminescence elements are formed above the first planarization film,
a moisture blocking layer is provided over the first planarization film,
each of the organic electroluminescence elements comprise a lower electrode, an upper electrode and an organic layer including an organic emissive material,
a second planarization film covers edge portions of the lower electrode and is formed in a non-emissive region of the display region,
in a region where a sealing member is bonded to the moisture blocking layer, the first planarization film extends under the moisture blocking layer,
the second planarization film terminates at a point which is further inside the panel with respect to the region where the moisture blocking layer is bonded to the sealing member, and
the moisture blocking layer is bonded to the sealing panel using the sealing member, thereby connecting the substrate with the sealing panel.

8. An organic electroluminescence panel according to claim 7, wherein
the moisture blocking layer is formed of silicon nitride.

9. An organic electroluminescence panel according to claim 7, wherein
another moisture blocking layer is provided under the first planarization film and above the thin film transistors, and
the two moisture blocking layers are directly connected in the peripheral portion of the substrate, so that a side portion of the first planarization film is enclosed by the two moisture blocking layers.

10. An organic electroluminescence panel, comprising a substrate including organic electroluminescence elements arranged in a matrix and a plurality of thin film transistors for driving the organic electroluminescence elements, wherein
a sealing panel covering an area above a display area in which the organic electroluminescence elements are disposed is connected to the substrate,
the plurality of thin film transistors are covered with a planarization film,
the organic electroluminescence elements are formed above the planarization film,
a moisture blocking layer is provided over the planarization film, and
in an area where the substrate and the sealing panel are connected, at least the moisture blocking layer and a sealing member are provided between the substrate and the sealing panel, and the moisture blocking layer is bonded to the sealing panel using the sealing member, thereby connecting the substrate with the sealing panel.

11. An organic electroluminescence panel according to claim 10, wherein
the moisture blocking layer is formed of silicon nitride.

* * * * *